United States Patent [19]

Harada et al.

[11] Patent Number: 5,128,278

[45] Date of Patent: Jul. 7, 1992

[54] METHOD OF FORMING A WIRING PATTERN FOR A SEMICONDUCTOR DEVICE

[75] Inventors: Yusuke Harada; Hiroyuki Tanaka, both of Tokyo, Japan

[73] Assignee: Oki Electric Industry Co., Ltd., Japan

[21] Appl. No.: 494,568

[22] Filed: Mar. 16, 1990

[30] Foreign Application Priority Data

Mar. 30, 1989 [JP] Japan ................... 1-76829

[51] Int. Cl.$^5$ ............................. H01L 21/44
[52] U.S. Cl. .................... 437/192; 437/190; 437/195; 437/203
[58] Field of Search ............ 437/190, 192, 195, 203; 148/DIG. 135

[56] References Cited

U.S. PATENT DOCUMENTS

| 4,597,164 | 7/1986 | Havemann . | |
| 4,898,841 | 2/1990 | Ho ........................ | 437/192 |
| 4,963,511 | 10/1990 | Smith ..................... | 437/192 |
| 4,981,809 | 1/1991 | Mitsuaki et al. ........ | 437/203 |
| 5,010,039 | 4/1991 | Ku et al. ................ | 437/195 |
| 5,026,658 | 6/1991 | Fuse et al. ............. | 437/203 |

FOREIGN PATENT DOCUMENTS

| 0211318 | 7/1986 | European Pat. Off. . | |
| 58-042227 | 3/1983 | Japan . | |
| 62-047122 | 2/1987 | Japan ..................... | 437/195 |
| 62-204523 | 9/1987 | Japan . | |
| 63-269517 | 11/1988 | Japan ..................... | 437/191 |
| 63-275113 | 11/1988 | Japan ..................... | 437/195 |

OTHER PUBLICATIONS

K. C. Saraswat, et al., "Selective CVD of Tungsten for VLSI Technology", Processing of 2nd Int'l Symp. VLSI Science & Tech, vol. 84-7, pp. 409-419.

Primary Examiner—Brian E. Hearn
Assistant Examiner—Laura M. Holtzman
Attorney, Agent, or Firm—Edward D. Manzo

[57] ABSTRACT

A method of forming a conductive pattern for a semiconductor device free from troubles attributable current leakage and having high reliability. Contact holes are formed in an insulating film formed over a semiconductor substrate by selectively etching portions of the insulating film corresponding to the contact holes so that portions of the semiconductor substrate corresponding to the contact holes are etched in recesses. Insulating side walls are formed on the side surface of the contact holes so as to reach the bottom of the recesses, the contact holes are filled up with a conductive substance by a selective CVD process, a conductive film is formed over the entire surface of insulating film so as to be connected to the conductive substance filling up the contact holes, and then portions of the conductive film are removed to form a conductive pattern.

7 Claims, 2 Drawing Sheets

METHOD OF FORMING A WIRING PATTERN FOR A SEMICONDUCTOR DEVICE

BACKGROUND OF THE INVENTION

1. Field of the Invention

The present invention relates to a method of forming a conductive pattern for a semiconductor device and more particularly, to a method of forming a conductive pattern for a semiconductor device, employing a selective tungsten chemical vapor deposition process (hereinafter, referred to as "selective WCVD process").

2. Description of the Prior Art

A method of depositing a metallic film in contact holes of a semiconductor device by a selective WCVD process will be described with reference to FIG. 1. An insulating film 4 is formed over an element isolating film 2. A diffused layer 3 formed in the surface of a silicon substrate (hereinafter, referred to as "Si substrate") 1, and holes 5 for contact holes are subsequently formed in the insulating film 4. Then, a tungsten film (hereinafter, referred to as "W film") 6 is deposited in the holes 5 by a selective WCVD process so that the surface of the W film 6 is flush with that of the insulating film 4. Subsequently, n Al-Si alloy film 7 is formed over the insulating film 4 and the W film 6 by a sputtering process, and then the A-Si alloy film 7 is subjected to photolithographic etching for patterning.

This method provides a highly reliable conductive pattern by filling up the contact holes with a metal to prevent disconnection attributable to faulty step coverage.

In forming the holes 5 by etching, the etching duration is extended beyond a time for overetching by 10 to 15% to compensate irregularities in the surface of the substrate. Consequently, the surfaces of portions of the diffused layer 3 corresponding to the holes 5 (contact holes) are etched in the form of recesses as shown in FIG. 2. The selective WCVD process, in general, uses $SiH_4$ gas to prevent encroachments and worm holes in the Si substrate, and forms the W film through a chemical reaction: $2WF_6 + 3SiH_4 \rightarrow 2W + 3SiF_4 + 6H_2$, in which a chemical reaction: $2WF_6 + 3Si$ (Si substrate) $\rightarrow 2W + 3SiF_4$ occurs between the WF6 gas and the Si substrate.

Accordingly, when the portion of the diffused layer 3 corresponding to the hole 5 is recessed, the $WF_6$ gas encroaches on the interface between the Si substrate 1 and the insulating film 4. The $WF_6$ gas, in turn, reacts with the surface of the Si substrate facing the interface to form an encroaching W film 8 in the interface before the W film fills up the recess beyond a level corresponding to the interface between the Si substrate 1 and the insulating film 4. The encroaching W film 8 increases leakage current. It is inferred that, during the deposition of the W film 6, the Si substrate contracts to form a gap in the interface allowing the $WF_6$ gas to penetrate the interface further, so that the encroaching W film 8 grows gradually in the interface.

SUMMARY OF THE INVENTION

Accordingly, it is an object of the present invention to provide a method of forming a conductive pattern free from leakage current by suppressing the lateral encroachment of a conductive substance while depositing the conductive substance selectively in contact holes.

It is another object of the present invention to provide a method of forming a conductive pattern having high reliability, capable of preventing disconnection of the conductive pattern attributable to faulty step coverage in the vicinity of contact holes.

To achieve the object, the present invention provides a method of forming a conductive pattern for a semiconductor device, comprising steps of forming a first insulating film over a Si substrate, selectively etching the first insulating film to form contact holes so that portions of the Si substrate corresponding to the contact holes are etched in recesses, forming a second insulating film over the first insulating film including the inner surfaces of the contact holes, forming the second insulating film over the side surface of the contact holes extending to the bottoms of the recesses through the anisotropic etching of the second insulating film as deep as to an extent in which the surface of the Si substrate is exposed, depositing a W film in the contact holes by a selective WCVD process, and forming a conductive layer connected to the W film deposited in the contact holes.

The above and other objects, features and advantages of the present invention will become more apparent from the following description taken in conjunction with the accompanying drawings.

DESCRIPTION OF THE PREFERRED EMBODIMENT

A method embodying the present invention will be described with reference to FIG. 3(A) to 3(F).

Figure 1:
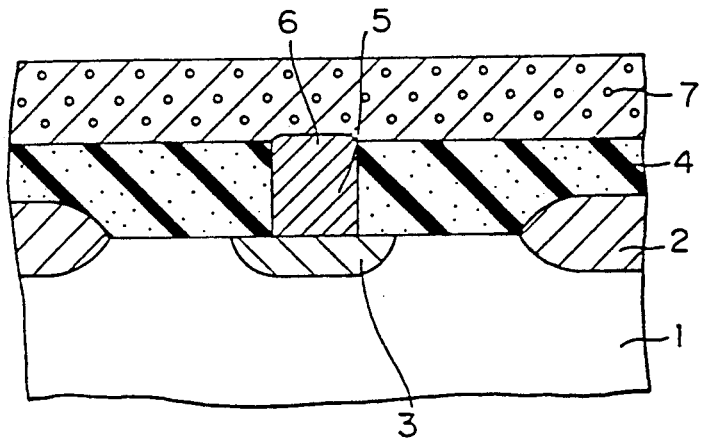
FIG. 1 is a sectional view of a conductive section of a semiconductor device for explaining a method of forming a conductive pattern by a selective WCVD process.
Figure 2:
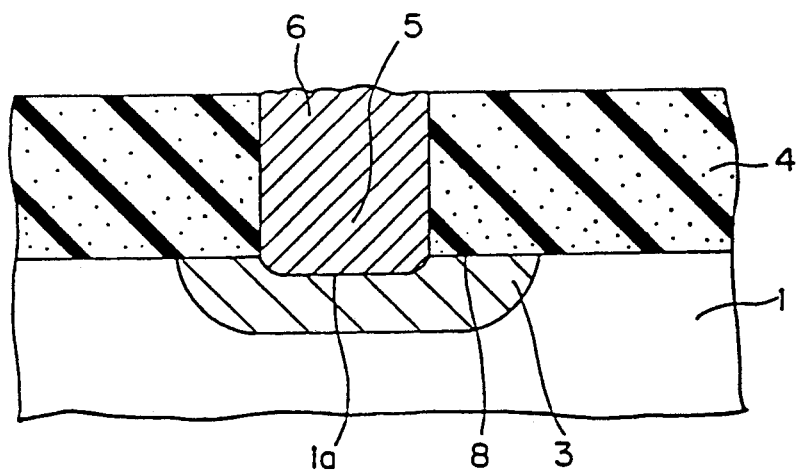
FIG. 2 is a sectional view of a conductive section of a semiconductor device for explaining the encroachment of a W film on the interface.
Figure 3A:
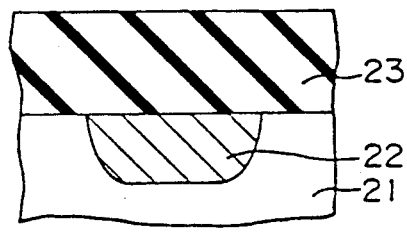
FIG. 3(A) to 3(F) are fragmentary sectional views of assistance in explaining steps of a method of forming a conductive pattern for a semiconductor device, embodying the present invention.

Referring to FIG. 3(A), a diffused layer 22 is formed in the surface of a Si substrate 21 by a conventional process, and then a layer insulating film 23, such as a BPSG film, is deposited in a thickness of 10,000 A by a CVD process. Then, the Si substrate is subjected to a heat treatment in a $N_2$ atmosphere at 950° C. for fifteen minutes to flatten the surface of the layer insulating film 23.

Figure 3D:
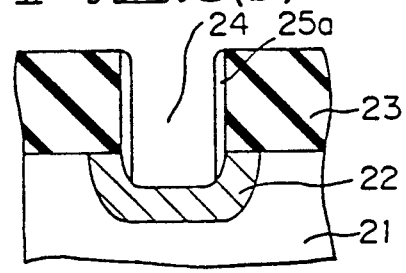
Figure 3B:
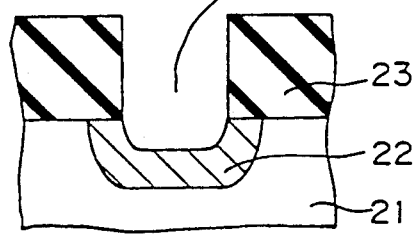

Subsequently, as shown in FIG. 3(B), contact holes 24 (only one of them is shown) are formed in the layer insulating film 23 by a photolithographic reactive ion etching (RIE) process. Conditions for the photolithographic RIE process are: flow rate of $C_2F_6$:15 sccm, flow rate of $CHF_3$:20 sccm, pressure of the chamber: 80 Pa, and RF supply power: 400 W. The layer insulating film 23 is overetched by 30 to 50% so that all the portions of the diffused layer 22 corresponding to the contact holes 24 over the entire area of the Si substrate 21 are exposed perfectly and recesses are formed as shown in FIG. 3(B) in the portions of the diffused layer 22.

Figure 3E:
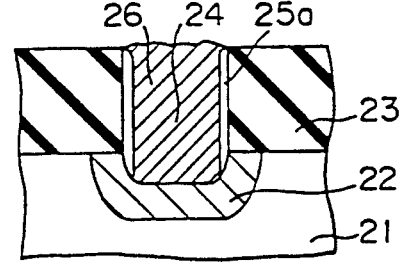
Figure 3C:
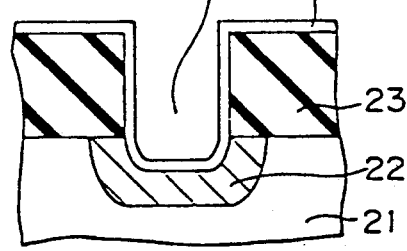

Then, as shown in FIG. 3(C), a thin insulating film 25, such as a thin $SiO_2$, of a thickness on the order of 500 A is formed by a CVD process over the entire surface of the layer insulating film 23, including the inner surfaces of the contact holes 24 and the exposed surfaces of the portions of the diffused layer 22 corresponding to the contact holes 24.

Then, the thin insulating film 25 is etched by an anisotropic RIE process to a depth substantially corresponding to the thickness (500 A) of the thin insulating film 25 to remove most portions of the thin insulating film 25 and to form side walls 25a from the insulating film 25 over the side surfaces of the contact holes 24 as shown in FIG. 3(D). The side walls 25a seal the interface between the Si substrate 21 and the layer insulating film 23 and cover the side surfaces of the recesses formed in the diffused layer 22.

Then, as shown in FIG. 3(E), the contact holes 24 are filled with a W film 26 by a selective WCVD process. The interfaces between the Si substrate 21 (the diffused layer 22) and the side walls 25a are exposed near the bottoms of the contact holes 24. Accordingly, the exposed interfaces between the Si substrate 21 and the side walls 25a are quickly covered soon with the W film 26 after the start of the selective WCVD process and are not exposed to the WF$_6$ gas for a long time, so that the W film 26 is unable to encroach on the interfaces. Even if the W film 26 should encroach on the interfaces, the W film 26 grows only upward along the interfaces and lateral encroachment of the W film 26 does not occur. Hence problems attributable to leakage current that flows through the encroaching W film are avoided.

Figure 3F:
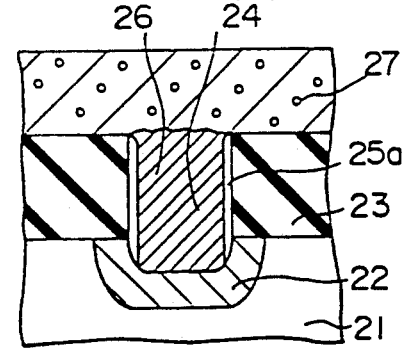

After the contact holes 24 have thus been filled up with the W film 26, an Al-Si alloy film 27 is formed over the layer insulating film by a sputtering process to a thickness of 7000 A so as to be connected to the W film 26 filling up the contact holes 24 as shown in FIG. 3(F). The A -Si alloy film is then subjected to a patterning process to form a conductive pattern.

As is apparent from the foregoing description, the method of the present invention forms a thin insulating layer so as to cover the side surfaces of the contact holes including the side surfaces of the recesses formed in the substrate by overetching. Therefore, the encroachment of the W film on the interfaces between the Si substrate and the insulating surface is avoided and a satisfactory semiconductor device with little leakage current is produced. Even if the W film should encroach on the interface in filling up the contact holes by the selective WCVD process, the W film encroaches upwardly only along the side surfaces of the contact holes and is unable to encroach laterally. Accordingly, such encroachment does not cause current leakage and does not cause troubles attributable to leakage current in the semiconductor device.

Although the present invention has been described as applying to the formation of a conductive pattern employing a selective WCVD process using WF$_6$ gas, naturally, the present invention is applicable also to forming a conductive pattern employing a selective CVD process using a fluoride of another metal which reacts easily with the Si forming the substrate.

Although the invention has been described in its preferred form with a certain degree of particularity, it is to be understood that many variations and changes are possible in the invention without departing from the scope thereof.

What is claimed is:

1. A method of forming a conductive pattern, comprising steps of:

(a) forming a first insulating film over a semiconductor substrate;
    (b) forming a contact hole by selectively etching a portion of the first insulating film and successively etching a recess portion of the semiconductor substrate corresponding to the contact hole;
    (c) forming a second insulating film over the entire surface of the first insulating film including the inner surface of the contact hole;
    (d) etching the second insulating film using an anisotropic etching process so that the bottom surface of the recess is exposed and a side wall coating remains in said contact hole the side wall coating being formed of the second insulating film and extending below the lower surface of said first insulating film and into the recess portion of the substrate, said side wall having an inclination surface facing to and defined by an edge portion of said recess;
    (e) filling up the contact hole with a conductive substance; and
    (f) forming a conductive pattern connected to the conductive substance filling up the contact holes.

2. A method of forming a conductive pattern according to claim 1, wherein the contact hole is filled up by the conductive substance using a selective CVD process.

3. A method of forming a conductive pattern according to claim 1, wherein said semiconductor substrate is a silicon substrate.

4. A method of forming a conductive pattern according to claim 2, wherein said conductive substance is tungsten.

5. A method of forming a conductive pattern according to claim 2, wherein the selective CVD process uses the gaseous fluoride of the conductive substance.

6. A method of forming a conductive pattern, comprising steps of:

(a) forming a first insulation film over a semiconductor substrate;
    (b) forming a contact hole by selectively etching a portion of the first insulating film;
    (c) etching a recess portion of the substrate corresponding to the contact hole;
    (d) forming a second insulating film over the entire surface of the first insulating film, including the inner surface of the contact hole and the recess portion of the substrate;
    (e) forming a side wall covering from a portion of the second insulating film on the side surfaces of the contact holes, the side wall covering extending to the bottom surface of the substrate recess portion by etching the second insulating film using an anisotropic etching process so that the bottom surface of the recess portion is exposed, said side wall having an inclination surface facing to and defined by an edge portion of said recess;
    (f) filling the contact hole with a conductive substance; and
    (g) forming a conductive pattern connected to the conductive substance filling the contact hole.

7. The method of claim 1 wherein said etching step (d) leaves said side wall coating descending below the lower surface of the first insulating film down to the bottom of said recess portion in the substrate.

* * * * *